(12) United States Patent
Hirose

(10) Patent No.: US 9,247,663 B2
(45) Date of Patent: Jan. 26, 2016

(54) WATERPROOF STRUCTURE, ELECTRONIC DEVICE, AND WATERPROOFING METHOD

(75) Inventor: Taro Hirose, Kanagawa (JP)

(73) Assignee: NEC Corporation, Tokyo (JP)

( * ) Notice: Subject to any disclaimer, the term of this patent is extended or adjusted under 35 U.S.C. 154(b) by 120 days.

(21) Appl. No.: 14/114,871

(22) PCT Filed: Apr. 25, 2012

(86) PCT No.: PCT/JP2012/061017
§ 371 (c)(1),
(2), (4) Date: Oct. 30, 2013

(87) PCT Pub. No.: WO2012/157414
PCT Pub. Date: Nov. 22, 2012

(65) Prior Publication Data
US 2014/0078655 A1 Mar. 20, 2014

(30) Foreign Application Priority Data
May 16, 2011 (JP) ................................. 2011-109206

(51) Int. Cl.
*H05K 5/06* (2006.01)
(52) U.S. Cl.
CPC . *H05K 5/061* (2013.01); *H05K 5/06* (2013.01)
(58) Field of Classification Search
CPC ............ H05K 5/061; H05K 5/06; H02G 3/08
USPC ............................. 174/50; 361/600; 439/535
See application file for complete search history.

(56) References Cited

U.S. PATENT DOCUMENTS 8,219,163 B2 * 7/2012 Peng et al. ................. 455/575.4
2003/0068035 A1 4/2003 Pirila et al.

FOREIGN PATENT DOCUMENTS

| EP | 1301011 A2 | 4/2003 |
|---|---|---|
| JP | 08-130382 A | 5/1996 |
| JP | 2005-244592 A | 9/2005 |
| JP | 2006-157465 A | 6/2006 |
| JP | 2007-157779 A | 6/2007 |
| JP | 2008-099347 A | 4/2008 |
| JP | 2011-103345 A | 5/2011 |

OTHER PUBLICATIONS

International Search Report of PCT/JP2012/061017 mailed Jul. 3, 2012 (4 pages).
Extended European Search Report issued by the European Patent Office for Application No. 12785598.9 dated Jul. 13, 2015 (6 pages).

* cited by examiner

*Primary Examiner* — Dhirubhai R Patel
(74) *Attorney, Agent, or Firm* — Wilmer Cutler Pickering Hale and Dorr LLP

(57) ABSTRACT

A waterproof structure includes a package having an opening; a lid part which is slidable between a first position that makes the opening be open and a second position that is located closer to the innermost of the opening than the first position and closes the opening; and an elastic member provided on a surface of the lid part, said surface facing an inner side of the opening, in a manner such that the elastic member is incapable of contacting the package when the lid part is positioned at the first position, and that the elastic member is pressed into the opening when the lid part is positioned at the second position. It is possible to prevent insufficient pressing of the elastic member into the opening, and thereby the relevant waterproof performance can be improved.

5 Claims, 3 Drawing Sheets

WATERPROOF STRUCTURE, ELECTRONIC DEVICE, AND WATERPROOFING METHOD

CROSS-REFERENCE TO RELATED APPLICATIONS

This application is a national stage application of International Patent Application No. PCT/JP2012/061017, filed on Apr. 25, 2012, and which claims the benefit of the priority of Japanese Patent Application No. 2011-109206, filed on May 16, 2011, the contents of which are incorporated herein by reference in their entirety.

TECHNICAL FIELD

The present invention relates to a waterproof structure configured to close an opening of an electronic device in a watertight manner, an electronic device that has such a structure, and a waterproofing method.

BACKGROUND ART

Recently, many popular electronic devices (e.g., cell phone terminals, portable game machines, notebook personal computers, and digital cameras) have, not only basic functions such as telephone conversation, game playing, document management, and photographing, but also additional functions (Internet connection) that make human's daily life easier. Accordingly, such electronic devices have penetrated deeply into daily life and are kept at all times in most cases. Therefore, the electronic devices may be operated outdoors in case of rain, for which electronic devices having a waterproof structure are in high demand so as to secure reliability of the electronic devices that are used in various scenes in real life.

Various waterproof structures for such electronic devices are known. Patent-Document 1 shows a sliding cover having a packing. In another example, a cover having a packing is pushed into an opening.

PRIOR ART DOCUMENT

Patent Document

Patent Document 1: Japanese Unexamined Patent Application, First Publication No. 2007-157779.

DISCLOSURE OF INVENTION

Problem to be Solved by the Invention

In the above-described waterproof structures, when the cover is open, the packing thereof is exposed outside, so that dust may be adhered to a surface of the packing or the surface may be scarred. Accordingly, a gap may be produced between the opening and the packing, which degrades waterproof performance.

In light of the above circumstances, an object of the present invention is to provide a waterproof structure that can improve the waterproof performance, an electronic device that has such a structure, and a waterproofing method.

Means for Solving the Problem

In order to achieve the above object, the present invention employs the following structure.

That is, a waterproof structure of the present invention comprises:

a package having an opening;

a lid part which is slidable between a first position that makes the opening be open and a second position that is located closer to the innermost of the opening than the first position and closes the opening; and an elastic member provided on a surface of the lid part, said surface facing an inner side of the opening, in a manner such that the elastic member is incapable of contacting the package when the lid part is positioned at the first position, and that the elastic member is pressed into the opening when the lid part is positioned at the second position.

In addition, an electronic device of the present invention comprises the above-described waterproof structure.

Furthermore, a waterproofing method of the present invention comprises:

arranging a lid part in a manner such that it is slidable between a first position that makes an opening of a package be open and a second position that is located closer to the innermost of the opening than the first position and closes the opening; and shifting the lid part from the first position to the second position, and pressing an elastic member into the opening, where the elastic member is provided on a surface of the lid part, said surface facing an inner side of the opening.

Effect of the Invention

In accordance with a waterproof structure, an electronic device comprising thereof, or a waterproofing method in accordance with the present invention, it is possible to prevent, for a package having an opening, insufficient pressing of an elastic member into the opening, and thereby the relevant waterproof performance can be improved.

MODE FOR CARRYING OUT THE INVENTION

Below, an electronic device 1 according to an embodiment of the present invention will be explained with reference to FIGS. 1 to 5.

The electronic device 1 may be a cell phone terminal or a portable game machine, and has an opening 10 such as a connector to be connected to an external device.

The electronic device 1 has a package 2 that contains structural parts and has the opening 10; and a cover 3 that slides over the opening 10 in an openable and closable manner.

In the following description, a direction in which the cover 3 slides is called a "sliding direction".

Figure 1:
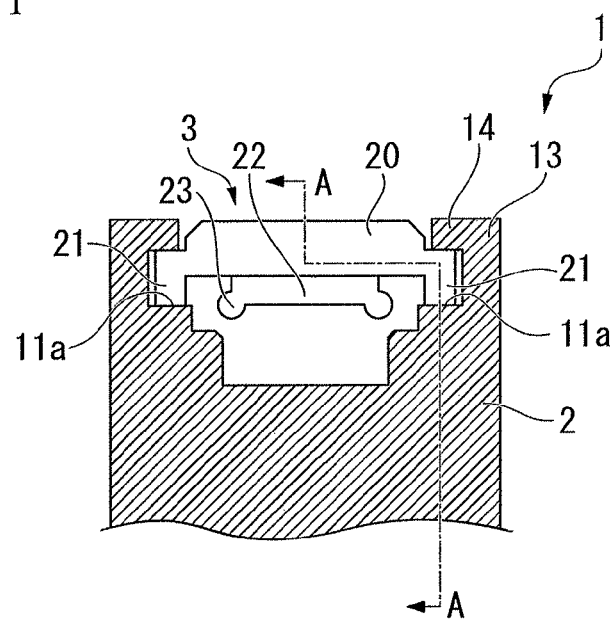
FIG. 1 is a sectional view of an electronic device in accordance with an embodiment of the present invention, which is observed from the front side thereof when its cover is located at a first position.
Figure 2:
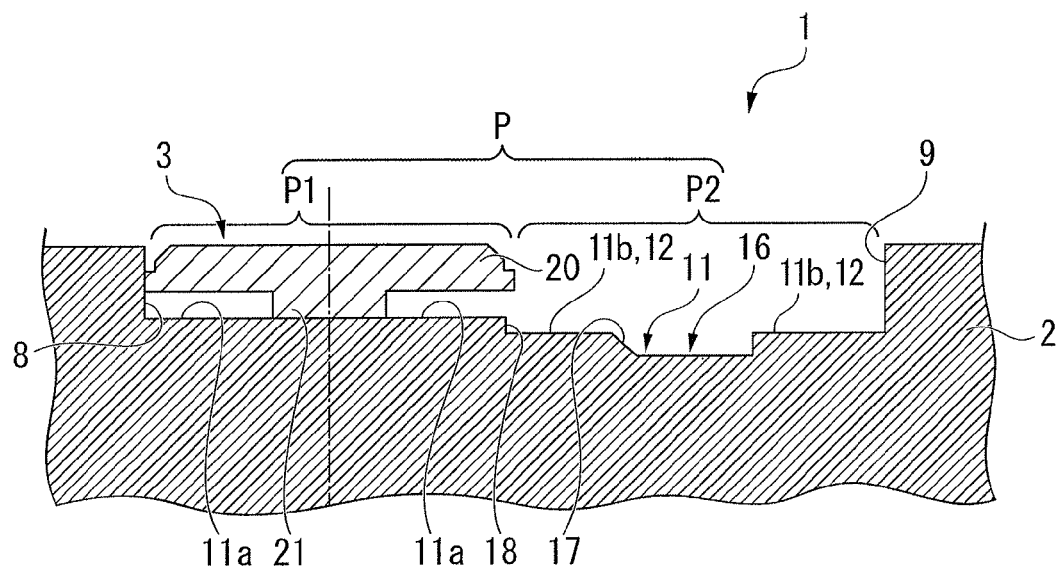
FIG. 2 is a sectional view (along line A-A in FIG. 1) of the electronic device in accordance with the embodiment of the present invention, which is observed from a lateral side thereof when its cover is located at the first position.
Figure 3:
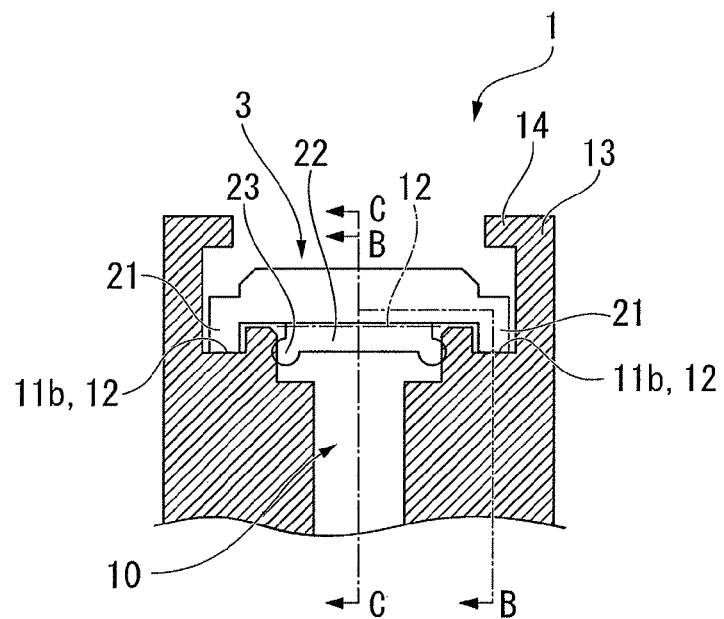
FIG. 3 is a sectional view of the electronic device in accordance with the embodiment of the present invention, which is observed from the front side thereof when its cover is located at a second position.
Figure 4:
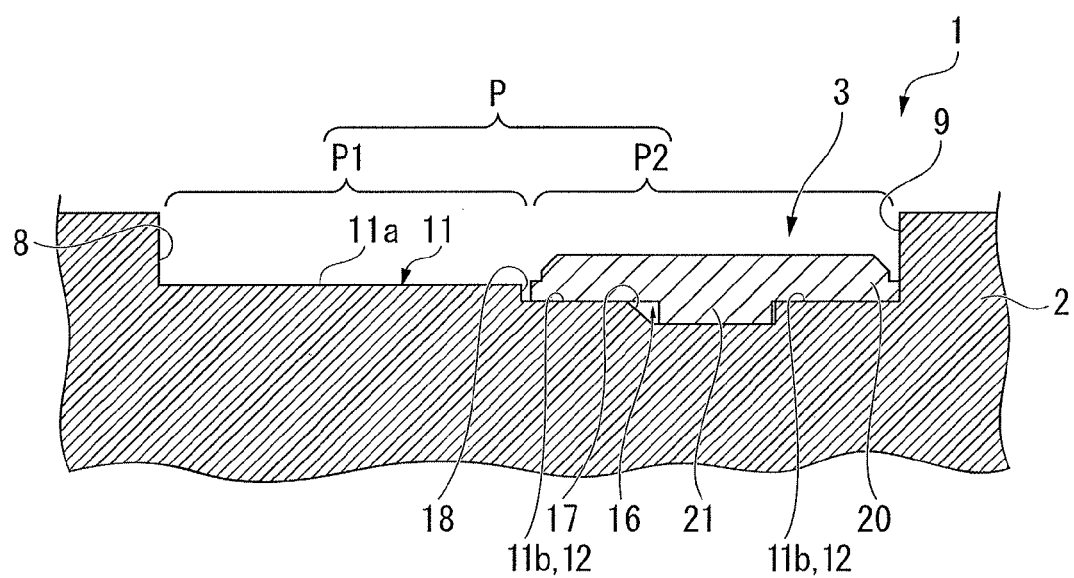
FIG. 4 is a sectional view (along line B-B in FIG. 3) of the electronic device in accordance with the embodiment of the present invention, which is observed from the lateral side thereof when its cover is located at the second position.
Figure 5:
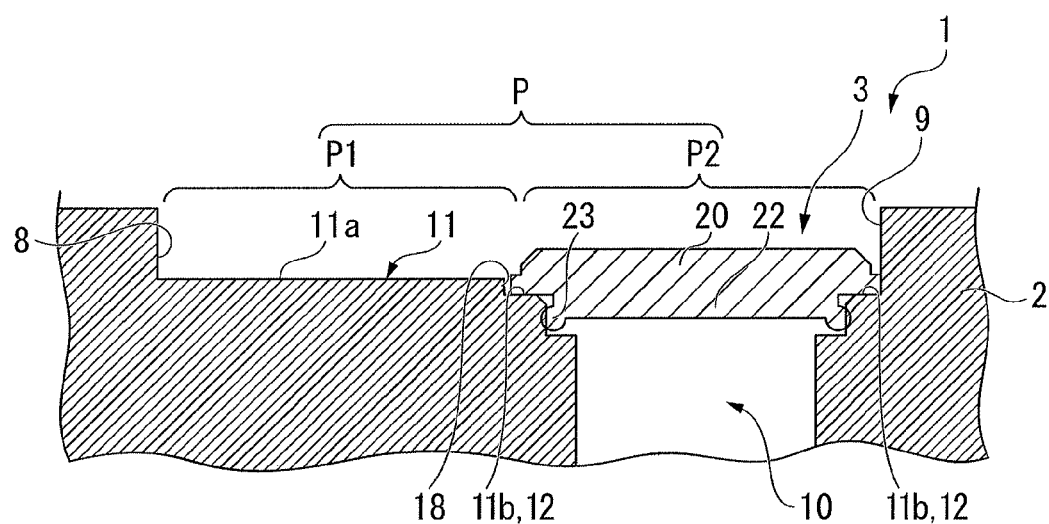
FIG. 5 is a sectional view (along line C-C in FIG. 3) of the electronic device in accordance with the embodiment of the present invention, which is observed from the lateral side thereof when its cover is located at the second position.

The opening 10 has a rectangular hole through which the inside of the package 2 is in communication with the outside thereof. The opening 10 is open outward via an opening surface 12 that is in parallel with the sliding direction of the cover 3. As shown in FIG. 3, the opening surface 12 in the present embodiment includes an open part and both side parts thereof in the width direction, and thus includes step parts.

The shape of the hole of the opening 10 is not limited to a rectangular shape.

The package 2 has a box form whose inside is hollow. A cover sliding area P is provided on an outer side of the opening 10, that is, in a space on an outer side thereof in the opening direction toward which the opening 10 is open.

In addition, a pair of standing portions 13 is provided at the package 2 in a manner such that they extend in the sliding direction and interpose the cover sliding area P from outer sides thereof in a direction (i.e., width direction) perpendicular to the opening direction and the sliding direction.

Furthermore, a pair of guide surfaces 11 is also provided at the package 2 in a manner such that they extend along both side edges of the opening surface 12 and support the cover 3 from the inner side thereof in the opening direction.

The shape of the package 2 is not limited to a box shape.

The cover sliding area P has (i) a first position P1 on one side of the area in the sliding direction, where at this position, the cover 3 completely exposes the opening surface 12, and (ii) a second position P2 on the other side of the area in the sliding direction, where at this position, the cover 3 completely closes the opening surface 12. In addition, (i) at an end of said one side (in the sliding direction) of the first position P1, a first wall 8 is provided in a manner such that it stands on the outside side of the package 2 in the opening direction, and (ii) at an end of said the other side (in the sliding direction) of the second position P2, a second wall 9 is provided in a manner such that it stands on the outside side of the package 2 in the opening direction. Accordingly, the cover sliding area P is formed between the first wall 8 and the second wall 9.

The standing portions 13 extend in the sliding direction from the first position P1 to the second position P2, and restricts outward movement of the cover 3 in the width direction. At the outside end (in the opening direction) of each standing portion 13, projection 14 is formed, which contacts the cover 3 from the outside and restricts outward movement thereof in the opening direction. That is, the standing portions 13 are formed so that the cover 3 is not detached from the package 2 when the cover 3 is present at any position of the cover sliding area P.

The guide surfaces 11 have (i) first guide surfaces 11*a* formed at the first position P1 and on an end face of the package 2, that faces the outside of the package 2 in the opening direction; (ii) second guide surfaces 11*b* which are formed at the second position P2 and coincide with both edges of the opening surface 12; (iii) step parts 18 formed at the boundary between the first guide surfaces 11*a* and the second guide surfaces 11*b* due to that the first guide surfaces 11*a* are located more outside than the second guide surfaces 11*b* in the opening direction; (iv) groove parts 16 formed in the middle of end faces of the second guide surfaces 11*b* (i.e., the end faces face the outside of the surfaces 11*b* in the opening direction); and (v) slopes 17 formed at faces of the groove parts 16, said faces facing the other side of the groove parts in the sliding direction.

The cover 3 has (i) a lid part 20 that closes the opening surface 12 from the outer side thereof in the opening direction; (ii) an elastic member 22 provided on a surface of the lid part 20 (i.e., on the inner side surface in the opening direction) so that the elastic member 22 is fit to the opening 10 at the second position P2; and (iii) a pair of guide ribs 21 (i.e., guided parts) fittable to the groove parts 16, where the guide ribs 21 protrude from the inner side surface of the lid part 20 so that they interpose the elastic member 22 from the outer sides thereof in the width direction.

The elastic member 22 has a size by which it is completely covered by the lid part 20 when observing the cover 3 from the outer side thereof in the opening direction. In addition, a press fit part 23 is formed at the outer-peripheral edge of a surface of the elastic member 22 (i.e., on the inner side surface in the opening direction) in a manner such that the press fit part 23 expands outward in the width direction and inward in the opening direction, so that when the cover 3 closes the opening surface 12 at the second position P2, the press fit part 23 is pressed onto the inner surface of the opening 10

In the above-described electronic device 1, the guide ribs 21 slide on the guide surfaces 11 while being engaged with the guide surfaces 11, so that the entire cover 3 slides between the first position P1 and the second position P2 in the cover sliding area P First, when the cover 3 is positioned at the first position P1, the elastic member 22 and the press fit part 23 do not contact any part of the package 2.

When the cover 3 is made to slide toward the second position P2, the guide ribs 21 passes the step parts 18, and the cover 3 approaches the second position P2, the guide ribs 21 slide down the slopes 17 formed at the groove parts 16 and are fit into the groove parts 16. Accordingly, the end faces (i.e., inner side faces in the opening direction) of the guide ribs 21 contact the bottom faces of the groove parts 16, and inner side surfaces (in the opening direction) of the lid part 20 closely contact the second guide surfaces 11*b* and the opening surface 12. In addition, an end face (on the other side in the sliding direction) of the lid part 20 contacts the second wall 9. Therefore, the lid part 20 is contained within a space surrounded by the step parts 18 and the second wall 9 so that the cover 3 reaches the second position P2.

When the cover 3 reaches the second position P2, it covers the opening surface 12 from the outer side thereof in the opening direction. In addition, since the press fit part 23 contacts and is pressed onto the inner surface of the opening 10, the opening surface 12 is completely closed and the opening 10 is cut off from the outside environment.

On the contrary, when the cover 3 is made to slide from the second position P2 to the first position P1, the guide ribs 21 escape from the groove parts 16 via the slopes 17, so that the press fit part 23 removes from the inner surface of the opening 10, and the lid part 20 is released from the second guide surfaces 11*b* and the opening surface 12. After that, the guide ribs 21 pass the step parts 18 and the end face (toward the above-described one side in the sliding direction) of the lid part 20 contacts the first wall 8, so that the cover 3 reaches the first position P1.

During the reciprocating movement of the cover 3 between the first position P1 and the second position P2, the inner side surface (in the opening direction) of the cover 3 slides while it always faces the inner side thereof in the opening direction. Accordingly, the elastic member 22 and the press fit part 23 are never exposed toward the outside environment, and thereby dust adherence or surface scarring can be prevented.

In addition, in the sliding motion of the cover 3 between the first position P1 and the second position P2, the guide ribs 21 are engaged with the guide surfaces 11, and an outer side surface of the lid part 20 (in the opening direction) is engaged with inner side surfaces (in the opening direction) of the projections 14. Furthermore, as for outer side surfaces (in the width direction) of the lid part 20 and the guide ribs 21, outward movement thereof in the width direction is restricted by the standing portions 13.

Accordingly, the movement of the cover 3 is restricted in both the opening direction and the width direction, so that it slides while detachment thereof from the package 2 is prevented.

Here, it is assumed that such a structure for preventing the detachment by supporting the cover 3 by means of the standing portions 13 formed at the package 2 is replaced with a structure in which a commonly used drawer member that joins the cover 3 to the package 2 is additionally provided at the cover 3 so as to prevent the detachment of the cover 3. In this case, the drawer member becomes worse for wear while repeating opening and closing of the cover 3, so that the member may be broken.

By contrast, in the present embodiment, parts that become worse for wear due to the opening and closing of the cover 3 are limited, so that change in shape or breakage of the cover 3 due to the relevant cause can be prevented, thereby failure in the fitting of the cover 3 into the opening 10 can be prevented. Additionally, the present embodiment causes no detachment of the cover 3 from the package 2 due to damage of the above-described drawer member, which may cause loss of the cover 3.

In the electronic device 1 of the present embodiment, the cover 3 slides in the cover sliding area P so as to open or close the opening surface 12. Therefore, the elastic member 22 and the press fit part 23 always face the inner side (of the opening) in the opening direction, and they are cut off from the outer side (of the opening) in the opening direction by the lid part 20, so that they are not directly influenced by the outside environment. Accordingly, the elastic member 22 and the press fit part 23 can be escaped from dust adherence or scarring. As a result, it is possible to prevent fitting performance of the press fit part 23 into the inner surface of the opening 10 from being degraded, and also to improve the relevant waterproof performance.

In the sliding structure of the present embodiment, the standing portions 13 that support the cover 3 from the outer sides thereof in the opening direction and the width direction are formed in the package 2. Therefore, change in shape or breakage of the cover 3 due to the repeated opening and closing operation thereof can be prevented while also preventing the detachment of the cover 3. Accordingly, failure in the fitting of the cover 3 into the opening 10 can be prevented, and thereby the relevant waterproof performance can be improved.

Although the present embodiment has been explained in detail, some modifications in design can be performed without departing from the technical concept of the present invention.

For example, the guide ribs 21 may be formed in the package 2 while the groove parts 16 may be formed in the cover 3. Also in this case, the guide ribs 21 is fit into the groove parts 16 at the first position P1 so that the cover 3 closes the opening surface 12 from the outer side thereof in the opening direction, thereby the opening 10 is cut off from the outside environment.

Additionally, in the present embodiment, when sliding the cover 3 so as to make the guide ribs 21 fall and fit into the groove parts 16, this process is smoothly performed by the slopes 17 provided at the groove parts 16. However, this is not a limited manner, and the falling and fitting process of the guide ribs 21 may be made easy by providing a knob or the like on the cover 3.

In addition, the cover 3 can slide in the cover sliding area P by means of a structure in which the guide ribs 21 slide while being engaged with the guide surfaces 11. However, the sliding structure is not limited to this manner. In another possible structure, the guide surfaces 11 are provided by guide members, each having a rail form, and the cover 3 is engaged with such guide members.

The basic structure of the electronic device 1 in accordance with the present invention is as follows:

The basic structure consists of (i) a package 2 having an opening 10; (ii) a lid part 20 which is slidable between a first position P1 that makes the opening 10 be open and a second position P2 that is located more inner for the opening 10 than the first position P1 and closes the opening 10; and (iii) an elastic member 22 provided on a surface (that faces the inner side of the opening 10) of the lid part 20 in a manner such that the elastic member 22 is incapable of contacting the package 2 when the lid part 20 is positioned at the first position P1, and that the elastic member 22 is pressed into the opening 10 when the lid part 20 is positioned at the second position P2.

The electronic device 1 of the present embodiment is an example for the above basic structure, and the present invention is not limited to the embodiment.

INDUSTRIAL APPLICABILITY

In accordance with the present invention, it is possible to prevent, for a package having an opening, insufficient pressing of an elastic member into the opening, and thereby the relevant waterproof performance can be improved.

REFERENCE SYMBOLS 1 electronic device
2 package
3 cover
8 first wall
9 second wall
10 opening
11 guide surface
11a first guide surface
11b second guide surface
12 opening surface
13 standing portion
14 projection
16 groove part
17 slope
18 step part
20 lid part
21 guide rib (guided part)
22 elastic member
23 press fit part
P cover sliding area
P1 first position
P2 second position

The invention claimed is:

1. A waterproof structure comprising:
a package having a box form that has a front surface with an opening towards an inside of the package to be connected to an external device and contains structural parts; to be connected to an external device and contains structural parts;
a plate-shaped lid part on the front surface of the package which is arranged by a sliding operation at any one of a first position that makes the opening be open and a second position that is located closer to an innermost of the opening than the first position and closes the opening; and an elastic member provided on a top surface of the lid part, said surface facing an inner side of the opening, in a manner such that the elastic member is incapable of contacting the package when the lid part is positioned at the first position, and that the elastic member is pressed into the opening when the lid part is positioned at the second position.

2. The waterproof structure in accordance with claim 1, further comprising:
- a guide part provided at the package over the first position and the second position in a manner such that a part corresponding to the first position is arranged more inner for the opening than a part corresponding to the second position; and
- a guided part that is provided at the lid part and is engaged with the guide part so that the guided part is slidable in a direction in which the guide part extends.

3. An electronic device that comprises a waterproof structure in accordance with claim 2.

4. An electronic device that comprises a waterproof structure in accordance with claim 1.

5. A waterproofing method comprising:
arranging a plate-shaped lid part on a front surface of a package having a box form by a sliding operation at any one of a first position that makes an opening of the package be open and a second position that is located closer to an innermost of the opening than the first position and closes the opening, wherein the package contains structural parts and the opening is to be connected to an external device, wherein the opening is located on the front surface of the package and extends towards an inside of the package; and shifting the lid part from the first position to the second position, and pressing an elastic member into the opening, where the elastic member is provided on a top surface of the lid part, said surface facing an inner side of the opening.

* * * * *